United States Patent [19]

Lee

[11] Patent Number: 4,575,648
[45] Date of Patent: Mar. 11, 1986

[54] COMPLEMENTARY FIELD EFFECT TRANSISTOR EXCLUSIVE OR LOGIC GATES

[75] Inventor: Charles M. Lee, Berkeley Heights, N.J.

[73] Assignee: AT&T Bell Laboratories, Murray Hill, N.J.

[21] Appl. No.: 564,930

[22] Filed: Dec. 23, 1983

[51] Int. Cl.$^4$ ............................................. H03K 19/21
[52] U.S. Cl. ..................................... 307/471; 307/451; 307/579; 307/291
[58] Field of Search ............... 307/443, 451, 452, 471, 307/576, 579, 585, 279, 291, 243

[56] References Cited

U.S. PATENT DOCUMENTS

| | | | |
|---|---|---|---|
| 4,006,365 | 2/1977 | Marzin et al. | 307/471 |
| 4,233,524 | 11/1980 | Burdick | 307/471 X |
| 4,318,015 | 3/1982 | Schade, Jr. | 307/279 X |
| 4,367,420 | 1/1983 | Foss et al. | 307/471 X |
| 4,417,161 | 11/1983 | Uya | 307/471 |

FOREIGN PATENT DOCUMENTS 0019059  2/1977  Japan .................................. 307/471

OTHER PUBLICATIONS

Griffin et al., "CMOS Four-Way XOR Circuit", *IBM Tech Disc Bull*, vol. 25, No. 11B, Apr. 1983, pp. 6066–6067.
R. H. Krambeck et al., "High-Speed Compact Circuits with CMOS," *IEEE Journal of Solid-State Circuits*, vol. SC-17, No. 3, Jun. 1982, pp. 614–619.

*Primary Examiner*—Stanley D. Miller
*Assistant Examiner*—D. R. Hudspeth
*Attorney, Agent, or Firm*—David I. Caplan

[57] ABSTRACT

A complementary MOS static EXCLUSIVE OR gate is formed by a PMOS logic network having a pair of cross-coupled PMOS transistors and an NMOS logic network having two parallel branches, each of the branches containing a separate pair of NMOS transistors connected in series.

5 Claims, 5 Drawing Figures

COMPLEMENTARY FIELD EFFECT TRANSISTOR EXCLUSIVE OR LOGIC GATES

FIELD OF THE INVENTION

This invention relates to digital logic circuits, and more particularly to such circuits for implementing EXCLUSIVE OR logic functions using complementary field effect transistor technology.

BACKGROUND OF THE INVENTION

An automatic data processing system typically contains a multiplicity of various relatively elementary types of logic circuit arrangements, or "logic gates", interconnected for computing relatively complex data processing functions as are desired by the users. Each of the logic gates typically can compute only a prescribed one of a group of many possible types of relatively elementary binary logic functions of binary input variables. A "binary input variable" is a logic variable which can have the logic value of 1 or 0, corresponding to TRUE or FALSE, respectively. In an electrical logic circuit, each such input variable is represented by a voltage signal at a voltage level that can be either relatively HIGH or LOW, respectively, to represent the respective logic 1 or logic 0 value of the corresponding input variable. Each such input voltage signal is applied to an input terminal of the logic gate, whereby an output terminal of the gate delivers a binary output signal voltage at a HIGH or LOW level, representing a logic 1 or logic 0, respectively, corresponding to the prescribed logic function of the gate, that is, as a function of the input variables.

Semiconductor integrated circuits are typically used for implementing the various logic gates in a data processing system. Each of the gates is implemented by a group of transistors, together with electrical interconnections between them, integrated in a semiconductor body at a major surface thereof. The various gates themselves are also electrically interconnected to form a logic circuit for computing the more complex data processing functions than those which are computed by a single logic gate, as are desired by the consuming public.

In such logic circuits, it is often desired to have a circuit arrangement of transistors for computing the EXCLUSIVE OR logic function of two binary input variables, say A and B, and it is also often desired to have a circuit arrangment for computing the EXCLUSIVE NOR function. Such arrangements are known as "EXCLUSIVE OR gates" and "EXCLUSIVE NOR gates", respectively. By the EXCLUSIVE OR function, it is meant that the output of the logic gate should be at a HIGH level—i.e., binary 1—if and only if either A or B is binary 1 but not both; otherwise, the output should be LOW. Thus the EXCLUSIVE OR is binary 1 if and only if A is not equal to B, and binary 0 if and only if A and B are equal (A=B). By the EXCLUSIVE NOR function is meant that the output of the logic gate should be HIGH (binary 1) if and only if A and B are equal (both HIGH, or both LOW), and is LOW (binary 0) if and only if the inputs A and B are unequal (one of them HIGH, the other of them LOW); whereas the EXCLUSIVE OR function of A and B is thus binary 1 if and only if A and B are unequal, and is binary 0 if and only if A and B are equal.

The logical inverse or complement of any binary logic variable X is defined as $(1-X)$ and is denoted by $\overline{X}$. Thus, in terms of corresponding electrical signals, when X is HIGH, $\overline{X}$ is LOW; and when X is LOW, $\overline{X}$ is HIGH. Accordingly, the EXCLUSIVE OR function is the complement or inverse of the EXCLUSIVE NOR function, and the EXCLUSIVE OR function of input variables A and B can be represented mathematically as being equal to $(\overline{A}B + A\overline{B})$. Moreover, whenever A and B are equal, $\overline{A}$ and B are unequal, as are A and $\overline{B}$. Thus the EXCLUSIVE OR function of inputs A and B is the same as the EXCLUSIVE NOR function of inputs $\overline{A}$ and B as well as of inputs A and $\overline{B}$. Accordingly, a logic gate which operates an EXCLUSIVE OR gate for inputs A and B can operate as an EXCLUSIVE NOR gate for inputs $\overline{A}$ and B, as well as for inputs A and $\overline{B}$. Thus, by changing one and only one of the inputs of an EXCLUSIVE OR gate into the complement of that input, the gate operates as an EXCLUSIVE NOR gate, and similarly an EXCLUSIVE NOR gate operates as an EXCLUSIVE OR gate by changing one and only one of the inputs into its complement.

Logic gates of all types, including the EXCLUSIVE OR gate, generally fall into two categories, static and dynamic. In a static logic gate, the outputs are valid (have the desired logic values) whenever all the input variables are valid. In a dynamic logic gate, however, because of the need for precharging, the outputs are not always valid even when all the input variables are valid; and these gates will not be considered further herein.

Static logic gates can be built in complementary field effect transistor (FET) technology, that is, each logic gate contains both n-type conductivity (or n-channel) FETs and p-type conductivity (or p-channel) FETs in order to implement the prescribed logic function of the gate. Complementary FET technology is also known as "CMOS", an acrostic for complementary metal oxide semiconductor, since such technology utilizes both p-channel MOS transistors (PMOS) and n-channel MOS transistors (NMOS). Each such MOS transistor operates as a switching element, having a gate electrode terminal as its control terminal, and having a source terminal and a drain terminal as its controlled terminals. That is, input signals are applied to the transistor's gate electrode terminal in order to control the resistance of, and hence the flow of current between, its source and drain terminals. More particularly, in a static CMOS logic gate, there is a PMOS portion which contains a network of PMOS transistors for driving the voltage of the output terminal of the logic gate to a HIGH or LOW level depending upon the specific combination of various inputs delivered to the input (gate) terminals of the PMOS transistors, and there is an NMOS portion which contains a network of NMOS transistors likewise for driving the voltage of the output terminal to the HIGH or LOW level. Accordingly, each network of NMOS and of PMOS transistors is called a logic network, and each of the NMOS and PMOS transistors is called a driver transistor. In addition, either the NMOS portion or the PMOS portion (but ordinarily not both simultaneously) may have no tendency to drive the voltage at the output terminal to any particular level, whereby the output is driven solely by only one of the PMOS and NMOS portions, depending upon the specific logic levels of the various inputs and the particular designs of the PMOS and NMOS networks. A static CMOS logic gate has the advantage that, except for the relatively very short time intervals during which the input variables are making transitions from one logic value to another, no current flows through the gate, and hence no power is consumed by the gate.

It is known in the prior art (FIG. 1) that an EXCLUSIVE OR logic gate 10 can be implemented in static CMOS technology by means of a PMOS portion, having a logic network consisting of a pair of cross-coupled PMOS transistors, T1 and T2, together with an NMOS portion, having a logic network consisting of a pair of cross-coupled NMOS transistors T3 and T4, as illustrated by the logic gate circuit arrangement 10 in FIG. 1. By "cross-coupled", it is meant that a gate terminal of each transistor is connected to the source or drain terminal of the other transistor. Here NMOS transistors are denoted by "n"; PMOS transistors by "p". The output of the circuit arrangement 10, implementing this EXCLUSIVE OR logic gate, is developed at output terminal X in response to input signals A and B. This output can be mathematically represented as $X = \bar{A}B + A\bar{B}$.

The circuit 10 suffers from an undesirable characteristic which occurs when both inputs A and B are initially LOW and A then goes from LOW to HIGH, and hence when the voltage at the output terminal X is supposed to go from LOW to HIGH. The undesirable characteristic may be seen from the following considerations. When both A and B are initially LOW, NMOS transistor T3 is OFF, but NMOS transistor T4 is ON because its gate electrode is controlled by the HIGH level of the $\bar{A}$ signal, which is the complement of the input A, as inverted by the inverter I. Both PMOS transistors T1 and T2 are OFF due to the back gate bias effect. Thus the output terminal X is initially LOW, as it should be for an EXCLUSIVE OR gate, for several consistent reasons: (1) the LOW level of input A blocks any current through the transistor T1 to X, (2) the LOW level of input B blocks any current through the transistor T2 to X, (3) the HIGH level of $\bar{A}$ cannot pass through the (initially OFF) transistor T3, and (4) the LOW level of B passes through the (initially ON) transistor T4. Then as the input A attempts to go HIGH at input terminal 11, it reduces the back gate bias effect on T1 and causes T1 to turn ON. The path through transistors T4 and T1, which are now both ON, undesirably enables the still LOW input B to conflict at terminal 11 with the input A and prevents its complement $\bar{A}$ from going LOW and thus from turning OFF transistor T4. Accordingly, unless the input signal A is reliably stronger than B (as weakened by having been delivered through T4 and T1 in the ON condition), the transistor T4 remains ON and the output terminal X tends to remain at the (weakened) LOW level of input B. Accordingly, X does not reliably go HIGH as it should for an EXCLUSIVE OR gate in response to a HIGH A and a LOW B. Although it is probable that the HIGH level of input A would ordinarily overpower the LOW level of input B and hence $\bar{A}$ would ordinarily turn T4 OFF as desired, nevertheless the conflict is still present and is undesirable because it tends to reduce the safety margin of reliability. Similar problems are encountered with static CMOS EXCLUSIVE NOR gates. Thus it would be desirable to have an EXCLUSIVE OR and EXCLUSIVE NOR gate in static CMOS which does not suffer from this problem, but without unduly increasing the number of required transistors and hence without unduly increasing the required precious area of underlying semiconductor in which the transistors are integrated.

SUMMARY OF THE INVENTION

In accordance with the invention, in a semiconductor integrated circuit, a static CMOS logic gate for performing an EXCLUSIVE OR or NOR function of a pair of binary input variables comprises a PMOS portion and an NMOS portion, a selected one of the portions comprising a pair of cross-coupled MOS driver transistors connected to an output terminal of the gate, and the other of the portions comprising a pair of branches connected to the output terminal, each of the branches comprising a separate pair of driver transistors connected in series with each other.

BRIEF DESCRIPTION OF THE DRAWING

This invention together with its advantages, features, and characteristics may be better understood from the following detailed description in which.

Figure 1:
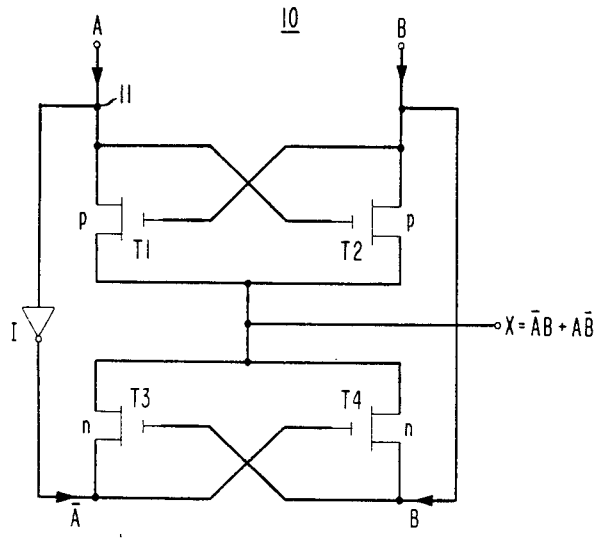
FIG. 1 is a circuit schematic of a static CMOS EXCLUSIVE OR gate in prior art.

In the drawings, p-channel FETs are denoted by the letter "p", n-channel FETs by "n". Typically, all p-channel FETs are PMOS transistors with thresholds of about 4.5 volts, and all n-channel FETs are NMOS transistors with thresholds of about 0.5 volts. The HIGH level of signal, denoted by $V_{DD}$, is typically about 5.0 volts, and the LOW level is typically about 0.0 volts (semiconductor substrate ground).

DETAILED DESCRIPTION

Figure 2:
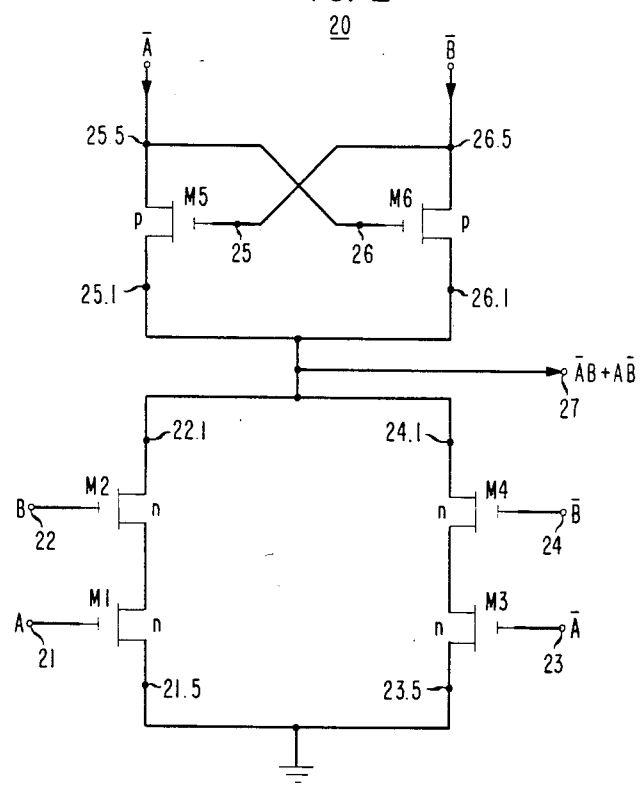
FIG. 2 is a circuit schematic of a static CMOS EXCLUSIVE OR gate in accordance with a specific embodiment of the invention.

FIG. 2 shows an EXCLUSIVE OR logic gate 20 in accordance with a specific embodiment of the invention. This gate 20 has an NMOS portion consisting of first and second parallel branches connected to output terminal 27, the first branch consisting of NMOS transistors M1 and M2 connected in series with each other, the second branch consisting of NMOS transistors M3 and M4 connected in series with each other. The gate 20 also has a PMOS portion consisting of cross-coupled transistors M5 and M6. Both portions are connected to the output terminal 27. The NMOS transisors M1, M2, M3, and M4 have input (gate) terminals 21, 22, 23, and 24, respectively; and the PMOS transistors M5 and M6 have their input (gate) terminals 25 and 26, respectively, connected to the source terminals 26.5 and 25.5 of M6 and M5, respectively, as in a cross-coupled arrangement. The source terminals 21.5 and 23.5 of M1 and M3, respectively, are connected to ground potential (0.0 volts). The drain terminals 22.1, 24.1, 25.1, and 26.1 of M2, M4, M5, and M6, respectively, are all connected to the output terminal 27 of the gate 20.

During operation, input signal A is applied to the gate terminal 21 of M1; input signal B is applied to the gate terminal 22 of M2; whereas the inverse or complement of A—i.e., $\bar{A}$—is applied to the gate terminal 23 of M3, and $\bar{B}$ is applied to the gate terminal 24 of M4. At the same time, $\bar{A}$ is also applied to the source terminal 25.5 of M5 and hence also to the gate terminal 26 of M6, and $\overline{B}$ is also applied to the source terminal 26.5 of M6 and hence also to the gate terminal 25 of M5.

That the logic gate 20 performs the EXCLUSIVE OR function can be seen from the following considerations. In the NMOS portions, if inputs A and B are different—i.e., if one input is HIGH (typically a level of about 5.0 volts above ground potential) and the other is LOW (typically at ground potential)—then either M1 or M2 is OFF and either M3 or M4 is OFF; therefore, there is no closed path from the output node through the NMOS portion to ground, so that the NMOS portion has no tendency either to pull up or to pull down the voltage level at the output terminal 27. On the other hand, in the PMOS portion if both inputs are different—say B is HIGH and A is low and hence $\overline{B}$ is LOW and $\overline{A}$ is HIGH—then $\overline{B}$ turns ON M5 which then passes through its source-drain path the HIGH level of A to the output terminal 27 of the logic gate 20. Thus the output of the logic gate 20 goes HIGH, i.e., logic 1, as is desired for an EXCLUSIVE OR gate when the inputs are different.

When the inputs A and B are the same, in the logic gate 20, then if they are both HIGH, in the NMOS portion both M1 and M2 are ON, whereby the output terminal 27 of the gate 20 is pulled down to ground potential, i.e., to logic 0. Likewise if A and B are both LOW, $\overline{A}$ and $\overline{B}$ are both HIGH and therefore turn ON M3 and M4, respectively; and again the output terminal 27 of the gate 20 is pulled to logic 0. At the same time, in the PMOS portion, if both $\overline{A}$ and $\overline{B}$ are HIGH, then both M5 and M6 are OFF and do not tend to pull the output terminal 27 up or down; and if both $\overline{A}$ and $\overline{B}$ are LOW, then both M5 and M6 are OFF due to the back gate bias effect and will not pull output terminal 27 of the gate 20 up or down. In any event, when $\overline{A}$ and $\overline{B}$ are at the same logic value, the PMOS portion enables the NMOS portion to pull down the voltage of the output terminal 27 to ground, i.e., to logic 0, as is desired in an EXCLUSIVE OR gate when both inputs are the same.

Accordingly, the logic gate 20 indeed operates as an EXCLUSIVE OR gate in all cases of inputs A and B. On the other hand, there is no possibility of conflicting signals passing from the PMOS portion through the NMOS portion as was the problem in the circuit 10 shown in FIG. 1, because all of the input signals in the NMOS portion are applied solely to gate terminals of NMOS transistors, and not to any source or drain terminals thereof.

An EXCLUSIVE OR logic gate could also be built without conflicting signals by fabricating the logic gate using the same NMOS portion as shown in FIG. 2 but using a PMOS portion having a logic network of four p-channel driver transistors connected together in complementary fashion to that of the NMOS portion. However, such a logic gate would require a total of eight driver transistors instead of the six driver transistors in the logic gate 20.

Notice that if the input A and its complement $\overline{A}$ are interchanged while B and $\overline{B}$ remain the same—that is, if the input A is applied to the input (gate) terminals 23 and 26 of M3 and M6 instead of to the input terminal 21 of M1, and at the same time the input $\overline{A}$ is applied to the input (gate) terminal of M1 instead of to the input terminals 23 and 26 of M3 and M6—then the output signal delivery by the output terminal 27 of the logic gate 20 will be in accordance with the EXCLUSIVE NOR function of A and B rather than the EXCLUSIVE OR function, as a logical consequence of interchanging one of the two inputs to an EXCLUSIVE OR gate. Thus, the logic gate 20 can also operate as an EXCLUSIVE NOR gate, either by interchanging A and $\overline{A}$ or by interchanging B and $\overline{B}$ (but not interchanging both A and $\overline{A}$, B and $\overline{B}$), as is to be expected of any EXCLUSIVE OR logic gate.

Figure 3:
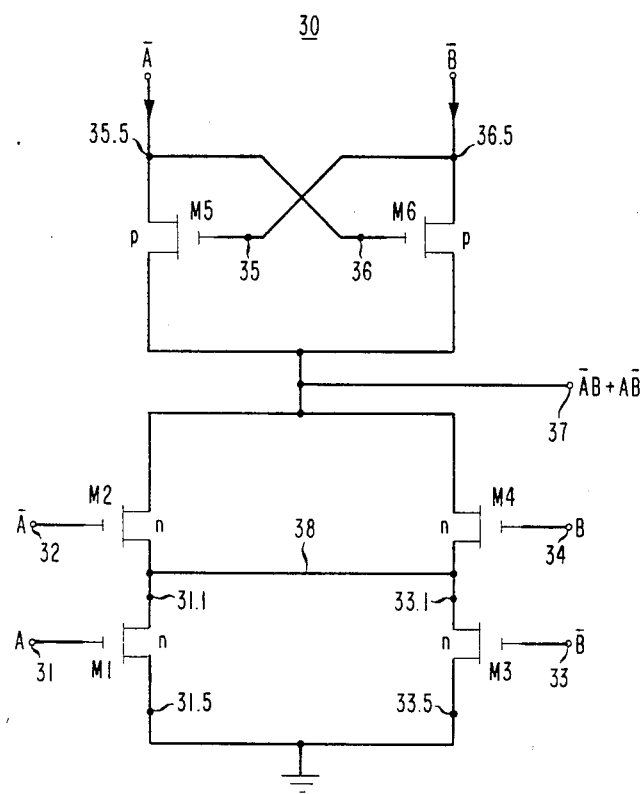
FIG. 3 is a circuit schematic of a static CMOS EXCLUSIVE OR gate in accordance with another specific embodiment of the invention.

FIG. 3 shows another EXCLUSIVE OR logic gate 30 in accordance with another specific embodiment of the invention. This logic gate 30 is similar in construction to that of the logic gate 20 previously described, and similar nodes in FIG. 3 have been denoted by the same reference numerals as those of FIG. 2 plus ten while similar transistors have been denoted by the same reference symbols. The difference between the logic gates 20 and 30 resides in the NMOS portion, whereas in the gate 30 the input signals A and B and their complements $\overline{A}$ and $\overline{B}$ are applied to M1, M4, M2, and M3, respectively, and the drain terminal 31.1 of M1 is connected to the drain terminal 33.1 of M3 by an interconnection 38.

During operation, since A and $\overline{A}$ are always different from each other, as are B and $\overline{B}$, the only way that the output terminal 37 of the logic gate 30 can be pulled down by the NMOS portion is through the interconnection 38 when either A and B are both HIGH (M1 and M4 are ON) or $\overline{A}$ and $\overline{B}$ are both HIGH (M2 and M3 are (ON). Thus the NMOS portion of the logic gate 30 operates in the same way as the NMOS portion of the logic gate 20. Since the PMOS portion of the logic gate 30 is constructed and operated in the same way as the PMOS portion of the logic gate 20, the logic gate 30 (FIG. 3) also operates as an EXCLUSIVE OR gate just like the logic gate 20 (FIG.2).

Figure 4:
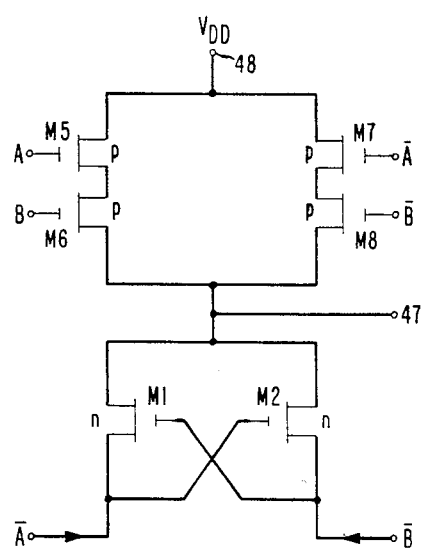
FIGS. 4 and 5 are circuit schematics of static CMOS EXCLUSIVE NOR gates in accordance with further specific embodiments of the invention.

FIG. 4 shows an EXCLUSIVE NOR gate 40 in accordance with another specific embodiment of the invention. Here the NMOS portion has a pair of cross-coupled transistors M1 and M2, whereas the PMOS portion has two parallel branches each having a separate pair of NMOS transistors (M5, M6 and M7, M8) connected in series. This gate 40 is thus the same as the EXCLUSIVE OR gate 20 previously described, except that NMOS and PMOS portions are interchanged, and the PMOS portion is supplied with steady voltage $V_{DD}$ at a terminal 48 (the terminal to which the source terminals of M5 and M7 are connected). Thereby the output of the gate 40 developed at its output terminal 47 is the inverse or complement of that of the gate 20, because for the same inputs A and B each of the PMOS transistors of the cross-coupled pair of the logic gate 40 is ON when the corresponding NMOS transistor of the logic gate 20 is OFF in response to the same input applied to the input (gate) terminal of the transistor; and further because whenever one of the parallel branches in the NMOS portion of the logic gate 40 forms a closed path (A and B both HIGH, or A and B both LOW), then another one of the parallel branches in the PMOS portion of the logic gate 20 also forms a closed path in response to the same inputs A and B, but whenever such a closed path is formed in the NMOS portion of the logic gate 20 the output terminal 27 is pulled down to a LOW level (logic 0) whereas the output terminal 47 of the logic gate 40 is pulled up to a HIGH level (logic 1). Thus both NMOS and PMOS portions of the logic gates 20 and 40 act to pull the output terminals 27 and 47 in opposite voltage polarity directions. Accordingly, the logic gate 40 implements the inverse or complementary logic function of EXCLUSIVE OR; that is, the logic gate 40 is an EXCLUSIVE NOR gate.

Figure 5:
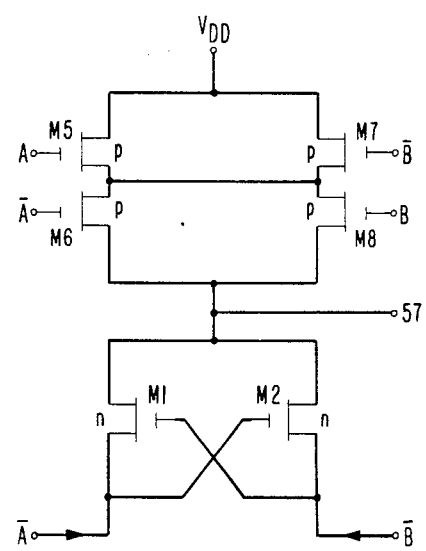

FIG. 5 shows an EXCLUSIVE NOR logic gate 50 in accordance with yet another specific embodiment of the invention. This logic gate 50 is similar to the logic gate 40 just described except for modification of the PMOS portion thereof in much the same way that the NMOS portion of the logic gate 20 was modified to yield the logic gate 30. Thus, the logic gate 50 delivers to its output terminal 57 an output signal which also represents the same EXCLUSIVE NOR function as does the logic gate 40.

Although the invention has been described in terms of specific embodiments, various modifications can be made without departing from the scope of the invention. For example, by interchanging the input A with its complement $\overline{A}$ and vice versa while retaining the inputs B and $\overline{B}$, the logic gates 20 and 30 then function as EXCLUSIVE NOR gates, and the logic gates 40 and 50 as EXCLUSIVE OR gates, in terms of the inputs A and B.

What is claimed is:

1. An integrated circuit comprising a complementary MOS logic gate consisting of:
    (a) a pair of MOS driver transistors, both of one channel conductivity type, each of such transistors having a control terminal which is connected to a first current-path terminal of the other and which is connected for receiving a different one of first and second input signals, and each having a second current-path terminal which is connected to an output terminal of the logic gate;
    (b) a first branch consisting of two driver transistors, both of a type opposite to the one channel type, connected in series with each other;
    (c) a second branch consisting of two other driver transistors, both of the type opposite to the one type, connected in series with each other;
    (d) first connecting means for directly connecting the first and second branches to the output terminal; and
    (e) second connecting means for directly connecting a terminal located in the series connection of the two driver transistors of the first branch to a terminal located in the series connection of the two other driver transistors of the second branch.

2. An integrated circuit comprising a complementary MOS logic gate, for developing a signal at an output terminal corresponding to an EXCLUSIVE OR or EXCLUSIVE NOR logic function of input signals, consisting of:
    (a) a pair of MOS transistors, both of the same one channel conductivity type, each of such transistors having a control terminal which is connected to a first current-path terminal of the other and having a second current-path terminal which is connected to the output terminal, the control terminal of each of the transistors being connected for receiving a different one of first and second input signals;
    (b) a first branch consisting of two driver transistors, both of a type opposite the one type, connected in series with each other, each of the two driver transistors having a control terminal for receiving one of the first and second input signals and its complement, respectively;
    (c) a second branch consisting of two other driver transistors, both of the type opposite the one type, connected in series with each other, each of the two other driver transistors having a control terminal for receiving the other of the first and second input signals and its complement, respectively; and
    (d) connecting means for directly connecting the first and second branches to the output terminal.

3. The logic gate of claim 2 which further consists of second connecting means for directly connecting the first and second branches to a voltage reference terminal.

4. In an integrated circuit, a complementary MOS logic gate, for developing a signal at an output terminal corresponding to an EXCLUSIVE OR or EXCLUSIVE NOR function of input signals, consisting of:
    (a) a pair of MOS transistors, both of the same one channel conductivity type, each of such transistors having a control terminal which is connected to a first current-path terminal of the other and having a second current-path terminal which is connected to the output terminal, the control terminal of each of the transistors being connected for receiving a different one of first and second input signals:
    (b) a first branch consisting of two driver transistors, each of a type opposite the one type, connected in series with each other, one of the two driver transistors having a control terminal for receiving the first input signal and the other of them having a control terminal for receiving the complement of the first input signal;
    (c) a second branch consisting of two other driver transistors, each of a type opposite the one type, one of the two other driver transistors having an input terminal for receiving the second input signal and the other of the two other driver transistors having a control terminal for receiving the complement of the second input signal;
    (d) first connecting means for directly connecting the first and second branches to the output terminal; and
    (e) second connecting means for directly connecting a terminal located in the series connection of the two driver transistors to a terminal located in the series connection of the two other driver transistors.

5. The logic gate of claim 4 which further consists of third connecting means for directly connecting the first and second branches to a voltage reference terminal.

* * * * *